Figure 1:
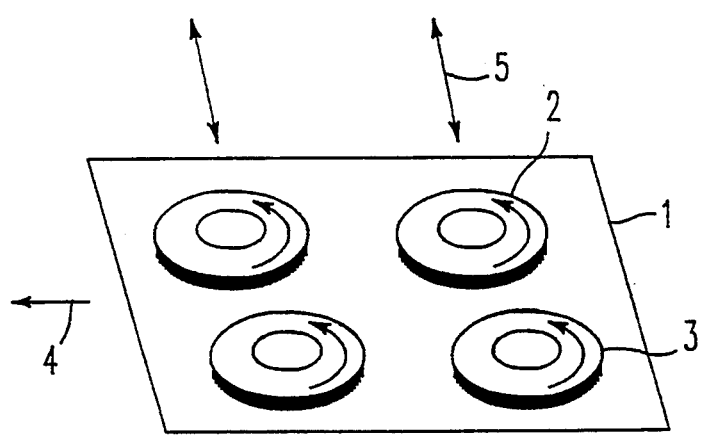

United States Patent [19]

Shimizu

[11] Patent Number: 5,436,105
[45] Date of Patent: Jul. 25, 1995

[54] METHOD OF MAKING SUBTRACTIVE OFFSET PRINTING PLATE

[75] Inventor: Shigeki Shimizu, Atsugi, Japan

[73] Assignee: Mitsubishi Chemical Corporation, Tokyo, Japan

[21] Appl. No.: 988,940

[22] PCT Filed: Jul. 16, 1992

[86] PCT No.: PCT/JP92/00906
§ 371 Date: Apr. 23, 1993
§ 102(e) Date: Apr. 23, 1993

[87] PCT Pub. No.: WO93/02396
PCT Pub. Date: Feb. 4, 1993

[30] Foreign Application Priority Data

Jul. 16, 1991 [JP] Japan ................... 3-175532

[51] Int. Cl.6 .................. G03F 7/26; G03F 7/30
[52] U.S. Cl. .......................... 430/141; 430/300;
430/325; 430/326; 430/331; 354/317; 354/319
[58] Field of Search ............... 430/141, 325, 326, 331,
430/300; 354/317, 319

[56] References Cited

U.S. PATENT DOCUMENTS 3,682,078  8/1972  Parker et al. ................... 354/317
4,186,006  1/1980  Kobayashi et al. ............. 430/331

FOREIGN PATENT DOCUMENTS 0096766  12/1983  European Pat. Off.
54-98614  8/1979  Japan.
59-67538  4/1984  Japan.
59-137954  8/1984  Japan.

Primary Examiner—Charles L. Bowers, Jr.
Assistant Examiner—Christopher G. Young
Attorney, Agent, or Firm—Oblon, Spivak, McClelland, Maier & Neustadt

[57] ABSTRACT

Disclosed is a method of making a subtractive offset printing plate, in which a subtractive offset printing plate containing at least a composite diazo photo sensitive material and a hydroxyl group-having acrylic copolymer in the photosensitive layer is imagewise exposed and the thus imagewise-exposed printing plate is automatically conveyed and developed with a developer with applying (a) developing brush(es) under pressure to the moving printing plate in the presence of the developer, the brush(es) being rotated around the axis vertical to the surface of the printing plate and being moved by reciprocating motion to the direction perpendicular to the moving direction of the printing plate and along the axis parallel to the surface of the printing plate. By the method, a good printing plate may be made, using a popular automatic additive developing machine of a particular system to which a subtractive developer involving few environmental problems is applied.

3 Claims, 1 Drawing Sheet

METHOD OF MAKING SUBTRACTIVE OFFSET PRINTING PLATE

FIELD OF THE INVENTION

The present invention relates to a method of making a subtractive offset printing plate. More particularly, it relates to a method of making a subtractive offset printing plate, which may well be developed even with an automatic developing machine for additive offset printing plate.

PRIOR ART

An additive offset printing plate is advantageous in general as the base plate may be manufactured inexpensively. At present, it is used essentially in the field of printing newspapers. Such an additive offset printing plate which has heretofore been utilized generally in printing needs lacquering on the image area so as to reinforce the area. For this, a developer to be used for making additive offset printing plates contains a component of removing the non-image area of the plate and a lacquer component of reinforcing the image area of the same, and the content of organic compounds therein reaches 50% by weight. Regarding the physical properties of the developer, it is highly more viscous rather than an aqueous solution and is near to a paint. For developing a printing plate, a relatively small amount of such a developer is applied to the surface of the plate and the non-image area of the plate is removed by strongly rubbing it with a brush. On the other hand, a developer for making a subtractive offset, printing plate which does not need lacquering or the like reinforcement of the image area is an alkaline aqueous solution having a content of organic compounds of being 10% by weight or less. Regarding the physical properties of the developer, it is near to water. For developing a subtractive offset printing plate, a relatively large amount of such a developer is applied to the surface of the printing plate almost without rubbing the surface with a brush, whereupon the non-image area is dissolved out into the developer and removed from the plate.

PROBLEMS TO BE SOLVED BY THE INVENTION

As mentioned above, the developer for making additive offset printing plates has a higher concentration of organic compounds therein than that for making subtractive offset printing plates. Therefore, treatment for discharging the waste of the used developer involves an environmental problem.

As one means of solving the problem, it may be considered to substitute the additive developing machine by a subtractive one. However, in newspaper printing companies and others, automatic and continuous printing plate making lines for exposure, developing, punching and folding of additive offset printing plates have already been equipped so as to efficiently make printing plates in a short period of time. It is not easy to substitute such expensive printing plate making lines by subtractive offset printing plate making lines.

As another means of solving the problem, it may easily be considered to feed a subtractive developer to the additive developing machine for developing subtractive printing plates. However, as mentioned above, there are noticeable differences in the composition of the photosensitive layer between the additive and subtractive printing plates, in the composition of the developer to be used between them and in the brush pressure to the developing machine between them. Therefore, even though a conventional subtractive developer and a subtractive printing plate are applied, so as to develop the subtractive printing plate, to the additive developing machine as manufactured only for use in making additive printing plate with an additive developer, satisfactory printing plates could not be made.

The present invention has been made in consideration of the preceding situation. The present inventor earnestly investigated in order to provide a method of making a subtractive offset printing plate by applying a subtractive printing plate and a subtractive developer which has few environmental problems to an additive developing machine where printing plates are developed by brushing development so as to make satisfactory printing plates and, as a result, has found that the intended object may be attained by the use of a subtractive offset printing plate containing a particular photosensitive material and a particular polymer in the photosensitive layer of the plate. On the basis of the finding, the inventor has achieved the present invention.

One object of the present invention is to provide a novel method of developing an offset printing plate by feeding a subtractive developer to a developing machine for additive offset printing plates.

Another object of the present invention is to provide a novel and industrially advantageous method of making an offset printing plate, which involves few environmental problems.

Such objects of the present invention may easily be attained by a method of making a subtractive offset printing plate, in which a subtractive offset printing plate containing at least a composite diazo photosensitive material and a hydroxyl group-having acrylic copolymer in the photosensitive layer is imagewise exposed and the thus imagewise-exposed printing plate is automatically conveyed and developed with a developer with applying (a) developing brush(es) pressured to the moving printing plate in the presence of the developer, the brush(es) being rotated around the axis vertical to the surface of the printing plate and being moved by reciprocating motion to the direction perpendicular to the moving direction of the printing plate and along the axis parallel to the surface of the printing plate.

BRIEF EXPLANATION OF THE INVENTION

FIG. 1 is a graphic view of showing one embodiment of the method of making a subtractive offset printing plate of the present invention.

EMBODIMENT FOR CARRYING OUT THE INVENTION

The subtractive offset printing plate for use in the present invention is one having a photosensitive layer containing at least a composite diazo photosensitive material and a hydroxyl group-having acrylic copolymer on a support.

The support is not specifically defined but may be any and every conventional one. Preferred is an aluminium plate. More preferably, the support is surface-treated by coarsening and/or anodic oxidation by an ordinary method. Though not limitative, preferably used is a support as produced by mechanically coarsening the surface of it or electrochemically coarsening the same in an electrolytic solution of hydrochloric acid of from 0.3 to 3% by weight or nitric acid of from 0.5 to 5% by weight, followed by treating the thus coarsened surface for forming Alumite thereon in an electrolytic solution of sulfuric acid of from 10 to 50% by weight or phosphoric acid of from 10 to 50% by weight and then by treating the thus formed Alumite surface with a hot water, sodium silicate, sodium nitrite or the like for sealing the pores on the surface, as so described in Japanese Examined Patent Publication Nos. 22036/1982, 16918/1982 and 49638/1982.

The composite diazo photosensitive material(s) to be contained in the photosensitive material of the printing plate of the present invention is/are, for instance, may be produced by blending a diazonium group-having aromatic compound: such as
4-diazonium-diphenylamine,
4-diazonium-4'-methoxydiphenylamine,
4-diazonium-4'-methyldiphenylamine,
4-diazonium-4'-chlorodiphenylamine,
3-diazonium-4,4'-dimethyldiphenylamine,
4-diazonium-2-carboxydiphenylamine,
1-diazonium-2-phenoxy-5-chlorobenzene,
1-diazonium-4-N,N'-dimethylaminobenzene, or
1-diazonium-4-morpholinobenzene,
and a diazonium-free aromatic compound having hydroxyl groups(s) and/or carboxyl group(s) such as phenol, 4-hydroxybenzoic acid, 1,4-dimethylol-benzene, 4-hydroxy-cinnamic acid or 2-phenoxy-ethonaol, followed by condensing them with (an) active carbonyl compound(s) such as formaldehyde, acetaldehyde, butylaldehyde or the like in the presence of (a) catalyst(s) such as sulfuric acid or the like. The above examples of the reactive ingredients of the photosensitive material are illustrative and are not intended to limit the present invention.

As the composite diazo photosensitive material for use in the present invention, especially preferred is one to be obtained by condensation of 4-diazonium-diphenylamine, 4-hydroxybenzoic acid and formaldehyde.

The ratio of the diazonium group-having aromatic unit to the diazonium group without aromatic unit to be in the composite diazo photosensitive material for use in the present invention is preferably within the range of from (40 to 90 mol %)/(60 to 10 mol %), more preferably from (50 to 80 mol %)/(50 to 20 mol %).

As the anion component of the diazonium salt, usable are organic solvent-soluble hexafluorophosphate, tetrafluoroborate, p-toluenesulfonate, benzenesulfonate and the like. Especially preferred is hexafluorophosphate.

The weight average molecular weight of the composite diazo photosensitive material is within the range of from 1000 to 5000, preferably from 2000 to 4000. The concentration of the diazo photosensitive material in the photosensitive layer is preferably from 5% by weight to 50% by weight.

The hydroxyl group-having acrylic copolymer(s) for use in the present invention is/are, though not limitative, preferably a copolymer of:
4-hydroxyphenylmetacrylamide,
2-hydroxyethyl (meth)acrylate, or
4-hydroxybutyl (meth)acrylate.

The molar ratio of 4-hydroxylphenylmetacrylamide is preferably from 5 to 20%; and that of 2-hydroxyethyl methacrylate is preferably from 20 to 50%.

The other comonomer components to be used for preparing the copolymer for use in the present invention are, though not limitative, preferably acrylonitrile, methacrylic acid, alkyl (meth)acrylates and N-vinylpyrrolidone, for example.

The weight average molecular weight of the copolymer is preferably from 30,000 to 200,000.

If desired, the copolymer may optionally be used together with any other copolymer such as known acrylic copolymers, polyesters, polyurethanes, epoxy resins and others as described in, for example, Japanese Unexamined Patent Publication No. 144641/1986 and Japanese Examined Patent Publication Nos. 7364/1977 and 43890/1977.

The copolymer is added to the photosensitive material in an amount of from 5 to 95% by weight, preferably from 20 to 90% by weight.

The photosensitive material of the printing plate of the present invention may contain a stabilizer such as those described in Japanese Examined Patent Publication No. 8460/1977, for the purpose of maintaining the storage stability of the diazo photosensitive material. Typical stabilizers for the purpose are, for example, organic compounds such as polyacrylic acids, tartaric acid, citric acid, oxalic acid, benzenesulfonic acid and naphthalene-sulfonic acid and inorganic compounds such as phosphoric acid, phosphorous acid and zinc chloride, though they are not limitative.

The amount of the stabilizer to be in the photosensitive material is preferably from 1% by weight to 20% by weight.

The photosensitive material may further contain a colorant such as those described in Japanese Examined Patent Publication No. 2203/1965, for the purpose of coloring the image area. Typical colorants for the purpose are, for example, dyes such as acridine dyes, cyanine dyes, styryl dyes and triphenylmethane dyes, pigments such as phthalocyanine pigments, and azide compounds and spiropyrane compounds to be visible by exposure, though they are not limitative.

The colorant may optionally be added to the photosensitive layer in an amount of from 1% by weight to 10% by weight.

The solvent(s) for use in the present invention is/are not specifically defined, but may be, for example, alcohols such as ethanol and butanol, cellosolves such as methyl cellosolve, ethyl cellosolve, methyl cellosolve acetate and ethyl cellosolve acetate, ketones such as cyclohexanone and methyl ethyl ketone, propylene glycol monomethyl ether, and esters such as methyl lactate and ethyl lactate.

For forming the photosensitive layer on the support, a photosensitive solution is prepared by dissolving a photosensitive component in (a) solvent(s), and this may be coated on the support by an ordinary method with, for example, a whirler, a roll coater, a die coater or curtain coater.

The thickness of the photosensitive layer to be coated on the support is desirably from 0.5 $\mu$m to 5 $\mu$m. The thus obtained photosensitive lithographic printing plate is exposed to an ultra-high pressure mercury lamp, a metal halide lamp, a xenon lamp or the like through a transparent negative original and then developed with an automatic developing machine in accordance with the preceding system to give a good printing plate.

The imagewise-exposed subtractive offset printing plate may be applied to a developing machine of a development system having (a) developing brush(es) which is/are rotated around the axis vertical to the surface of the printing base plate and moved by reciprocating motion along the axis perpendicular to the moving direction of the plate and parallel to the surface of the plate, along with a subtractive developer.

Concretely, for example, FIG. 1 is referred to, the printing plate of the present invention may preferably be applied to the developing machine of the illustrated developing system, in which a developer (not shown) for subtractive printing plates is dropped onto a printing base plate 1 moving at a rate of approximately from 30 to 150 cm/min while developing brushes 2, each having a diameter of the rotating surface of being approximately from 10 to 20 cm are rotated around the axis vertical to the surface of the offset printing base plate at a rotation speed of approximately from 200 to 400 rpm, for example, to the direction 3 and are simultaneously moved by reciprocating motion to the direction 5 and perpendicular to the moving direction 4 of the printing base plate along the axis parallel to the surface of the base plate at a speed of approximately from 15 to 50 cycles per minute. The rotating direction of the developing brushes is not limited to only the illustrated direction 3, but it may be a reversed one. Alternatively, developing brush(es) rotating to the direction 3 and other developing brush(es) rotating to the direction opposite to the direction 3 may be combined.

In carrying out the present invention, the angle of defining the position and direction for the rotation and movement of the preceding developing brushes are not always necessary to be strictly defined. The brushes may be satisfactory to be rotated around the axis substantially vertical to the surface of the printing base plate and to be moved by reciprocating motion along the axis substantially perpendicular to the moving direction of the base plate and substantially parallel to the surface of the base plate. In addition, the embodiment of the rotation and movement of the preceding developing brushes includes various modifications, provided that the developing brushes may well be applied to the printing plate pressured for effecting suitable development of the printing plate in the presence of a smaller amount of a subtractive developer than the amount of the same to be used in general development of ordinary subtractive printing plates, that is, in the presence of the same amount of a subtractive developer as the amount of an additive developer to be used in general development of ordinary additive printing plates.

The material of the developing brushes is preferably nylon; and the pressure of the brushes to be applied to the imagewise-exposed printing base plate is preferably selected from the range of approximately from 0.15 to 0.45 lb/in² (approximately from 10 to 32 g/cm²) to the offset printing base plate. In general, plural developing brushes are arranged in front and rear and right and left and rubbed to the printing plate for development of it generally for from 3 to 30 seconds under the preceding condition. If the moving rate of conveying the plate is lower than the defined range, the operatability would be poor. On the contrary, if it is more than the same, sufficient development of the plate could not be effected. If the rotation number of the developing brushes is less than the defined range, development of the printing plate would be uneven. On the contrary, if it is more than the same, the developer would be scattered. As a specific example of the developing machine of the kind for use in the present invention, mentioned is one described in U.S. Pat. No. 3,682,078.

As the developer for use in the present invention, a conventional alkaline subtractive developer may be employed. Especially preferred is an alkaline aqueous developer having pH of from 9 to 13. For instance, mentioned is an alkaline aqueous developer containing organic compounds in an amount of 10% or less, as described in, for example, Japanese Examined Patent Publication Nos. 42860/1981 and 53306/1985.

The alkali compounds to be in the developer for use in the present invention are not specifically limitative, but for instance, usable are inorganic compounds such as sodium silicate, potassium silicate, potassium hydroxide, sodium hydroxide and sodium carbonate, and organic compounds such as mono-, di- or tri-methylamine, mono-, di- or tri-ethylamine, mono-, di- or tri-ethanolamine and n-butylamine. The concentration of the compound in the developer is preferably from 0.3 to 3% by weight.

As other organic compounds also usable as an alkali compound in the developer, further mentioned are esters such as benzyl acetate and ethylene monoglycol monobutyl ether acetate, ketones such as methyl isobutyl ketone, and alcohols such as ethylene glycol monophenyl ether and benzyl alcohol. The concentration of the compound in the developer may be 10% by weight or less and is preferably selected from the range of from 2 to 10% by weight.

In the present invention, a subtractive developer having the composition mentioned below is preferably used.

| | |
|---|---|
| Benzyl Alcohol | 1 to 5 wt. % |
| Sodium Alkylbenzenesulfonate | 1 to 5 wt. % |
| Monoethanolamine | 0.5 to 3 wt. % |
| Water | 90 to 97 wt. % |

The developer of the kind is fed to the developing machine, in carrying out the present invention, generally in an amount of approximately from 50 to 300 ml per m² of the offset printing base plate being processed.

EXAMPLES

The present invention will be explained in more detail by way of the following examples and production examples. The present invention is not whatsoever restricted by them, unless otherwise overstepping the scope of it.

PRODUCTION OF EXAMPLE 1

Production of PHX (acrylic copolymer)

A copolymer of 4-hydroxyphenylmethacrylamide (HYPMA), acrylonitrile (AN), ethyl acrylate (EA) and methacrylic acid (MAA) was produced in accordance with the production example described in Japanese Unexamined Patent Application No. 144642/1986.

The weight average molecular weight of the obtained copolymer was identified to be 86,000 by measurement by gel permeation chromatography (GPC). The molar composition of the copolymer was found to comprise 14% of HYPMA, 25% of AN, 50% of EA and 11% of MAA measured by nuclear magnetic resonance (NMR).

PRODUCTION EXAMPLE 2

Production of PHEMA (acrylic copolymer)

A copolymer of 2-hydroxyethyl methacrylate (HEMA), acrylonitrile (AN), methyl methacrylate (MMA) and methacrylic acid (MAA) was produced in accordance with Example 2 described in Japanese Unexamined Patent Application No. 64351/1985.

The weight average molecular weight of the obtained copolymer was identified to be 160,000 measured by GPC measurement. The molar composition of the copolymer was found to comprise 50% of HEMA, 20% or AN, 25% of MMA and 25% of MAA.

PRODUCTION EXAMPLE 3

Production of Diazo Photosensitive Material (DR)

14.5 g (50 mmol) of p-diazodiphenylamine sulfate was dissolved in 40 g of concentrated sulfuric acid under cooling with ice, and 1.05 g (35 mmol) of paraformaldehyde was gradually added thereto while the reaction temperature was controlled to be not higher than 10° C. After continuous stirring for 2 hours under cooling with ice, the reaction mixture was dropped into 500 ml of ethanol, and the precipitates formed were taken out by filtration. The precipitation were washed with ethanol and dissolved in 100 ml of water. Then, an aqueous solution of 6.8 g of zinc chloride was added thereto. The precipitates formed were taken out by filtration, washed with ethanol and dried at 25° C. for 3 hours to obtain 15 g of diazo resin/zinc chloride complex salt. 15 g of the complex salt was dissolved in 150 ml of water, and an aqueous solution of 8 g of ammonium hexafluorophosphate was added thereto. The precipitates thus formed were taken out by filtration, washed with water and then ethanol, and dried at 15° C. under reduced pressure overnight to obtain 12.5 g of diazo resin hexafluorophosphate. The weight average molecular weight of the thus obtained DR resin was 2100.

PRODUCTION EXAMPLE 4

Production of Composite Diazo Photosensitive Material (DHR)

11 g (37.5 mmol) of p-diazodiphenylamine sulfate and 1.73 g (12.5 mmol) of p-hydroxybenzoic acid were dissolved in 44 g of concentrated sulfuric acid under cooling with ice, and 1.4 g (45 mmol) of paraformaldehyde was gradually added thereto to effect condensation with cooling at 10° C. or lower. After continuous stirring for 2 hours under cooling with ice, the reaction mixture was dropwise added to 340 ml of ethanol so that the polymer formed was precipitated out and taken out by filtration. The polymer precipitates were washed with ethanol and then dissolved in 90 ml of water, and an aqueous solution of 6.6 g of zinc chloride was added thereto. The precipitates thus formed were taken out by filtration and washed with ethanol. The precipitates were dissolved in 200 ml of water, and an aqueous solution of 6.1 g of ammonium phosphorofluoride was added thereto for salt exchange reaction. By dropping acetone to the reaction mixture, precipitates were formed. They were taken out by filtration, washed with water and ethanol and dried at 25° C. under reduced pressure overnight, to obtain 9.8 g of composite diazo photosensitive material having 75 mol % of diazo unit and 25 mol % of hydroxybenzoic acid unit. The weight average molecular weight of the thus obtained DHR resin was 3000.

PRODUCTION EXAMPLE 5

Production of PVF (polyvinyl formal)

80 g of polyvinyl alcohol having a polymerization degree of 500 and a saponification degree of 70% was dissolved in 800 ml of dioxane, and 72 g of formalin (35%) and 8 g of hydrochloric acid (35%) were added thereto and reacted with stirring with a stirrer at 75° C. for 7 hours. The reaction solution was poured into aqueous 10% sodium hydroxide solution to precipitate a polymer formed. After the solution was neutralized, this was filtered to obtain the polymer. The polymer was washed with water. The polymer thus obtained was then dried under reduced pressure and under the condition of 50° to 60° C. for one full day, and the weight of it was measured to be 77 g (yield: 92%). The composition of the polymer was analyzed by $^{13}$C-nuclear magnetic resonance (hereinafter referred to as NMR). From the analysis, the copolymer was identified to comprise 50 mol % of vinyl formal, 5 mol % of vinyl alcohol and 45 mol % of vinyl acetate. By measurement by gel permeation chromatography (hereinafter referred to as GPC), the weight average molecular weight of the copolymer was 81,000.

PRODUCTION EXAMPLE 6

Production of PVB (polyvinyl butyral)

80 g of polyvinyl alcohol having a polymerization degree of 500 and a saponification degree of 70% was dissolved in 800 ml of dioxane, and 70 g of butylaldehyde and 8 g of hydrochloric acid (35%) were added thereto and reacted with stirring with a stirrer at 70° C. for 7 hours. The reaction mixture was then processed in the same manner as in Production Example 5 to obtain 96 g (yield: 90%) of polyvinyl butyral. By analysis of the composition of the polymer by $^{13}$C-NMR, it was found to be a copolymer comprising 49 mol % of vinyl butyral, 6 mol % of vinyl alcohol and 45 mol % of vinyl acetate. By GPC measurement, the weight average molecular weight of the copolymer was identified to be 101,000.

MANUFACTURE EXAMPLE 1

Formation of Brush-grained Plate

An aluminium plate was grained with a nylon brush and a 40-mesh Pamiston suspension. Next, this was etched in aqueous 5% sodium hydroxide solution at 50° C. for 10 seconds, washed with water and neutralized and washed with 10% nitric acid. Next, this was subjected to anodic oxidation in 30% sulfuric acid bath under the condition of 30° C. and 2.5 A/dm$^2$ for 2 minutes and then to pore-sealing treatment in aqueous 2% sodium metasilicate solution at 80° C. for 20 seconds, to obtain a brush-grained plate.

MANUFACTURE EXAMPLE 2

Formation of Electrolytic-grained Plate

An aluminium plate was subjected to electrolytic abrasion in 1% hydrochloride acid bath under the condition of a temperature of 25° C. and a current density of 50 A/dm$^2$ for one minutes, then desmutted in aqueous 5% sodium hydroxide solution at 40° C. for 10 seconds and washed with water. Next, this was subjected to anodic oxidation and pore-sealing treatment under the same conditions as those in Manufacture Example 1 to obtain an electrolytic-grained plate.

EXAMPLE 1

A photosensitive liquid having the composition mentioned below was prepared, and this was coated on the sand-grained plate as obtained by the brush-graining method of Manufacture Example 1 by whirler coating to form a photosensitive layer of 1 g/m² thereon.

| Acrylic Copolymer (PHX Production Example) | 20 g |
|---|---|
| Composite Diazo Photosensitive Material (DHR Production Example) | 4 g |
| Victoria Pure Blue BOH (produced by Hodogaya Chemical Co.) | 0.4 g |
| Polyacrylic Acid AC10L (produced by Nippon Pure Pharmaceuticals Co.) | 0.2 g |
| Methyl Cellosolve | 500 g |

Next, the subtractive developer having the composition mentioned below was put in a tank of an additive developing device (LITHOPLATER-D, manufactured by Western Lithotech Co., USA).

| Sodium Metasilicate | 40 g |
|---|---|
| Benzyl Alcohol | 20 g |
| Water | 1000 g |

To the previously coated lithographic printing base plate were irradiated UV rays of 350 mj/cm² through a negative film, and the plate was then developed in LITHOPLATER-D under the conditions mentioned below.

| Shape of Brushes: | 14 cm-diameter UNFLAGGED brushes (two brushes in left and right and two brushes in front and rear, totaling four brushes) |
|---|---|
| Brush Rotation: | 307 rpm |
| Brush Reciprocation: | 23 back-and-forth cycles/min |
| Plate Moving Speed: | 3.5 ft/min (about 106.7 cm/min) |
| Brush Pressure: | 0.23 lb/in² (about 16.2 g/cm²) |

The dot reproduction range of the thus obtained printing plate was examined to the result that from 1% to 99% dots were reproduced with a 150-screen and that the dot thickness at 50% dots was good to be 4.5%.

COMPARATIVE EXAMPLE 1

In the same manner as in Example 1, a photosensitive liquid having the composition mentioned below was coated on the support by whirler coating to form a photosensitive layer of 1.5 μm thick thereon. Thus, a photosensitive lithographic printing plate was obtained.

| Acrylic Copolymer (PHX Production Example) | 20 g |
|---|---|
| Diazo Photosensitive Material (DR Production Example) | 2 g |
| Victoria Pure Blue BOH (produced by Hodogaya Chemical Co.) | 0.4 g |
| Polyacrylic Acid AC20L (produced by Nippon Pure Pharmaceuticals Co.) | 0.2 g |
| Methyl Cellosolve | 500 g |

The thus obtained photosensitive lithographic printing plate was processed with the same developer and developing machine under the same conditions as those in Example 1. Small dots of 10% or less were lost with a 150-screen. The line image area was scratched with brushes, and the result was not satisfactory.

EXAMPLE 2

A photosensitive liquid having the composition mentioned below was coated on the sand-grained plate as manufactured by the electrolyte-graining method of Manufacture Example 2, by whirler coating to form a photosensitive layer of 1.5 μm thick. Thus, a photosensitive lithographic printing plate was obtained.

| Polyvinyl Formal (PVF Production Example) | 6 g |
|---|---|
| Acrylic Copolymer (PHEMA Production Example) | 14 g |
| Composite Diazo Photosensitive Material (DHR Production Example) | 2 g |
| Victoria Pure Blue BOH (produced by Hodogaya Chemical Co.) | 0.4 g |
| Tartaric Acid | 2 g |
| Methyl Lactate | 500 g |

Next, a developer having the composition mentioned below was prepared and fed to an automatic additive developing machine (LITHOPLATER-G, manufactured by Western Lithotech Co.).

| Benzyl Alcohol | 3.5% |
|---|---|
| Sodium Alkylbenzenesulfonate | 3.0% |
| Monoethanolamine | 2.0% |
| Water | 91.5% |

The previously coated photosensitive lithographic printing plate was put in an oven having a temperature of 40° C. and a relative humidity of 80% for 5 days. To this were irradiated UV rays of 350 mj/cm² through a negative film. This was then developed with the LITHOPLATER-G under the conditions mentioned below.

| Shape of Brushes: | 14 cm-diameter FLAGGED brushes (two brushes in left and right and two brushes in front and rear, totaling four brushes) |
|---|---|
| Brush Rotation: | 300 rpm |
| Brush Reciprocation: | 25 back-and-forth cycles/min |
| Plate Moving Speed: | 2.5 ft/min (about 76.2 cm/min) |
| Brush Pressure: | 0.23 lb/in² (about 16.2 g/cm²) |

The plate was processed with the same developer and developing device under the same conditions as above to the result that from 1% to 98% dots were reproduced with a 150-screen.

COMPARATIVE EXAMPLE 2

A photosensitive liquid having the composition mentioned below was prepared and coated on the sand-grained plate as manufactured by the electrolytic-graining method of Manufacture Example 2 by whirler coating to form a photosensitive layer of 1.5 μm thereon. Thus, a photosensitive lithographic printing plate was obtained.

| Acrylic Copolymer (PHEMA Production Example) | 14 g |
|---|---|
| Polyvinyl Formal (PVF Production Example) | 6 g |
| Diazo Photosensitive Material (DR Production Example) | 4 g |
| Victoria Pure Blue BOH | 0.4 g |

| | |
|---|---|
| Tartaric Acid | 0.2 g |
| Methyl Lactate | 500 g |

The thus obtained photosensitive lithographic printing plate was put in an oven having a temperature of 40° C. and a relative humidity of 80%. Then, this was processed with the same developer and developing device under the same developing conditions as those in Example 2 to the result that small dots of 5% or less were lost at a 150-screen. The solid image area had many scratches formed by brushing. The result was not satisfactory.

COMPARATIVE EXAMPLE 3

A photosensitive liquid having the composition mentioned below was prepared and coated on a brush-grained support by whirler coating in the same manner as above to form a photosensitive layer of 1 μm thereon.

| | |
|---|---|
| Polyvinyl Butyral (PVB Production Example) | 20 g |
| Composite Diazo Photosensitive material (DHR Production Example) | 4 g |
| Victoria Pure Blue BOH | 0.4 g |
| Polyacrylic Acid AC20L (produced by Nippon Pure Pharmaceuticals Co.) | 1 g |
| Methyl Lactate | 500 g |

Next, a developer having the composition mentioned below was prepared and fed into an automatic additive developing machine LITHOPLATER-G (manufactured by Western Lithotech Co.).

| | |
|---|---|
| Benzyl Alcohol | 3.5% |
| Sodium Alkylbenzenesulfonate | 3.0% |
| Monoethanolamine | 2.0% |
| Water | 91.5% |

The previously coated photosensitive lithographic printing plate was put in an oven having a temperature of 40° C. and a relative humidity of 80% for 5 days. To this were irradiated UV rays of 350 mj/cm$^2$ through a negative film. This was then developed with the LITHOPLATER-G under the conditions mentioned below.

| | |
|---|---|
| Shape of Brushes: | 14 cm-diameter FLAGGED brushes (two brushes in left and right and two brushes in front and rear, totaling four brushes) |
| Brush Rotation: | 300 rpm |
| Brush Reciprocation: | 25 back-and-forth cycles/min |
| Plate Moving Speed: | 2.5 ft/min (about 76.2 cm/min) |
| Brush Pressure: | 0.23 lb/in$^2$ (about 16.2 g/cm$^2$) |

In the dot reproducing range of the thus obtained photosensitive lithographic printing plate, small dots of 3% or less were lost at a 150-screen. In addition, the non-line image area did not dissolve out completely and was colored thinly due to the remained photosensitive layer in the area.

ADVANTAGE OF THE INVENTION

In accordance with the present invention as explained in the above, where a subtractive offset printing plate having a photosensitive layer containing a composite diazo photosensitive material and a hydroxyl group-having acrylic copolymer is used, a good printing plate may be formed by the use of a popular automatic additive developing machine of a particular system using a subtractive developer involving few environmental problems.

What is claimed is:

1. A method of making a subtractive offset printing plate, in which a subtractive offset printing plate containing at least a composite comprising an admixture of a diazo photo sensitive material and a hydroxyl group-having acrylic copolymer in photosensitive effective amounts in the photosensitive layer is imagewise exposed and the thus imagewise-exposed printing plate is automatically conveyed and developed with a developer by applying (a) developing brush(es) under pressure to the moving printing plate in the presence of the developer, the brush(es) being rotated around the axis vertical to the surface of the printing plate and being moved by reciprocating motion to the direction perpendicular to the moving direction of the printing plate and along the axis parallel to the surface of the printing plate, wherein said diazo photo sensitive material comprises a blend of (a) a diazonium group containing aromatic compound and (b) a diazonium-free aromatic compound having hydroxyl groups and/or carboxyl groups, each condensed with (an) active carbonyl compound(s).

2. The method of making a subtractive offset printing plate as claimed in claim 1, in which the brushing pressure of the developing brush(es) to the subtractive offset printing plate is from 0.15 to 0.45 lb/in$^2$ (approximately from 10 to 32 g/cm$^2$).

3. The method of making a subtractive offset printing plate as claimed in claim 1 or 2, in which the developer is an alkaline aqueous solution.

* * * * *